(12) United States Patent
Moon

(10) Patent No.: US 12,191,164 B2
(45) Date of Patent: Jan. 7, 2025

(54) HYBRID MOLD CHASE SURFACE FOR SEMICONDUCTOR BONDING AND RELATED SYSTEMS AND METHODS

(71) Applicant: Micron Technology, Inc., Boise, ID (US)

(72) Inventor: Byung Hoon Moon, Taichung (TW)

(73) Assignee: Micron Technology, Inc., Boise, ID (US)

( * ) Notice: Subject to any disclaimer, the term of this patent is extended or adjusted under 35 U.S.C. 154(b) by 253 days.

(21) Appl. No.: 17/675,949

(22) Filed: Feb. 18, 2022

(65) Prior Publication Data

US 2023/0268198 A1    Aug. 24, 2023

(51) Int. Cl.
| | |
|---|---|
| *H01L 21/56* | (2006.01) |
| *B29C 33/42* | (2006.01) |
| *H01L 23/31* | (2006.01) |
| *H01L 23/498* | (2006.01) |
| *H01L 25/065* | (2023.01) |

(52) U.S. Cl.
CPC ............ *H01L 21/565* (2013.01); *B29C 33/42* (2013.01); *H01L 23/3121* (2013.01); *H01L 23/49894* (2013.01); *H01L 25/0657* (2013.01); *H01L 2225/06506* (2013.01); *H01L 2225/06651* (2013.01); *H01L 2225/06562* (2013.01)

(58) Field of Classification Search
CPC ............... H01L 21/565; H01L 23/3121; H01L 23/49894; H01L 25/0657; H01L 2225/06506; H01L 2225/0651; H01L 2225/06562; B29C 33/42; H10B 80/00
See application file for complete search history.

(56) References Cited

FOREIGN PATENT DOCUMENTS

JP        2004-193379    *    7/2004

* cited by examiner

*Primary Examiner* — Timor Karimy
(74) *Attorney, Agent, or Firm* — Perkins Coie LLP

(57) ABSTRACT

Mold chases for molding semiconductor devices and/or components of semiconductor devices, the resulting semiconductor devices and/or their components, and related systems and methods are disclosed herein. In some embodiments, the mold chase includes a first clamp and a second clamp having a substrate engaging surface oriented towards the first clamp. The substrate engaging surface can have a hybrid surface texture that includes a first region and a second region at adjacent the first region (on a lateral side of the first region). The first region can include a first surface texture that is relatively smooth. The second region can include a second surface texture that is relatively rough compared to the first surface texture. The first surface texture can prevent mold bleed during a molding process. The second surface texture can reduce electrostatic discharge events during an ejection from the mold chase.

14 Claims, 10 Drawing Sheets

HYBRID MOLD CHASE SURFACE FOR SEMICONDUCTOR BONDING AND RELATED SYSTEMS AND METHODS

TECHNICAL FIELD

The present disclosure is generally related to systems and methods for releasing semiconductor substrates from a mold chase. In particular, the present technology relates to a semiconductor mold chase with a hybrid surface texture.

BACKGROUND

Microelectronic devices, such as memory devices, microprocessors, and other electronics, typically include one or more semiconductor dies mounted to a substrate and encased in a protective covering. The semiconductor dies include functional features, such as memory cells, processor circuits, interconnecting circuitry, etc. Semiconductor die manufacturers are under continuous pressure to reduce the volume occupied by semiconductor devices while increasing the capacity and/or speed of the resulting semiconductor assemblies. To meet these demands, semiconductor die manufacturers often stack multiple semiconductor dies vertically on top of each other and increasingly tightly pack bonding sites to increase the capacity and/or the performance of semiconductor devices within a limited area on a circuit board or other element to which the semiconductor devices and/or assemblies are mounted. Further, semiconductor substrates are manufactured in bulk then singulated to reduce the costs associated with production. However, as the components of the semiconductor devices continue to shrink, they become more susceptible to damage from various sources during manufacturing.

Figure 1:
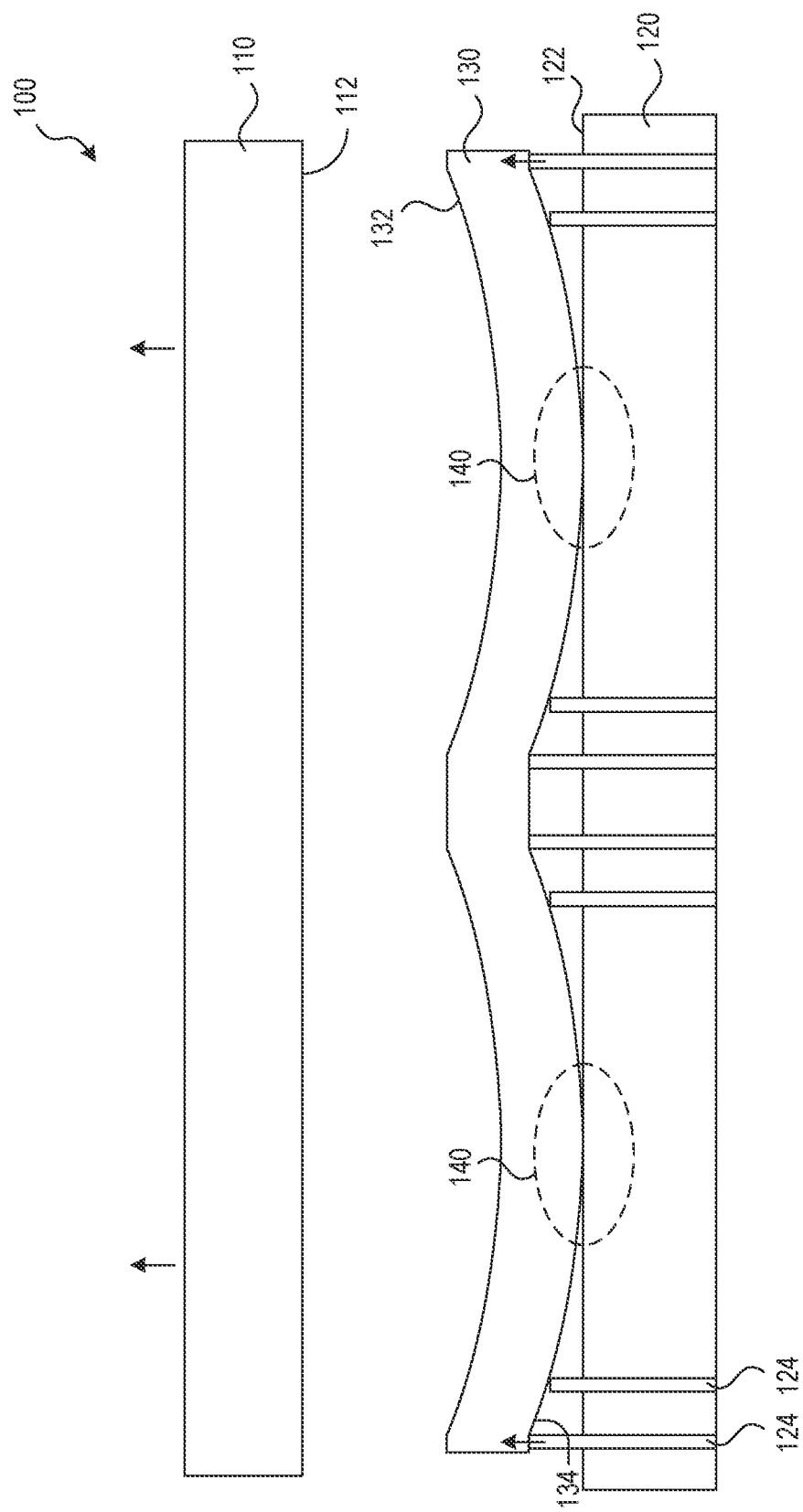
FIG. 1 is a partially schematic diagram of a mold chase releasing a semiconductor substrate in accordance with some embodiments of the present technology.

The drawings have not necessarily been drawn to scale. Similarly, some components and/or operations can be separated into different blocks or combined into a single block for the purpose of discussion of some of the implementations of the present technology. Moreover, while the technology is amenable to various modifications and alternative forms, specific implementations have been shown by way of example in the drawings and are described in detail below. The intention, however, is not to limit the technology to the particular implementations described.

DETAILED DESCRIPTION

Overview

Semiconductor molding processes make use of a mold chase with first and second clamps that engage, compress, and heat various semiconductor materials during the molding process. However, many semiconductor substrates, such as printed circuit boards for graphics double data rate (GDDR) memories, are susceptible to various sources of failure when being ejected from the mold chase. In particular, the inventor has realized that adhesion between the semiconductor substrates and the mold clamp surfaces can lead to electrostatic discharge (ESD) events as the semiconductor substrates are ejected. The ESD events can crack or chip the semiconductor substrates themselves and/or damage various electrical structures (e.g., redistribution layers, bond sites, and the like) on the substrates.

Mold chases that avoid, or reduce, the problems associated with ESD events while molding semiconductor devices and/or components of semiconductor devices, the resulting semiconductor devices and/or their components, and related systems and methods are disclosed herein. In some embodiments, the mold chase includes a first clamp and a second clamp having a substrate engaging surface oriented towards the first clamp. The substrate engaging surface can have a hybrid surface texture that includes a first region and a second region adjacent the first region (e.g., on a lateral side of the first region). The first region can include a first surface texture that is relatively smooth (e.g., a cleaned, treated, and/or polished surface texture). The second region can include a second surface texture that is relatively rough (e.g., a matted, uneven, and/or unpolished surface texture) compared to the first surface texture. The first surface texture can prevent mold bleed during a molding process. The second surface texture can reduce electrostatic discharge events during an ejection from the mold chase. In some embodiments, the substrate engaging surface includes alternating regions having the first surface texture and the second surface texture, with one or more portions corresponding to an individual semiconductor component on a semiconductor substrate in the mold chase.

For example, in some embodiments, the mold chase includes a first chase end and a second chase end having a semiconductor engaging surface facing the first chase end. The semiconductor engaging surface can include an array of molding regions each corresponding to an individual semiconductor component on a sheet of a semiconductor substrate. Each molding region can include a peripheral region having the second surface texture (e.g., the matted surface texture) and a central region between the peripheral portions and having the first surface texture (e.g., the polished surface texture). The peripheral regions are positioned to engage an electrical contact portion of the individual semiconductor component during a molding process while the central regions are positioned to engage a central portion of the individual semiconductor component. The central regions can also include a centermost region with a mold runner that allows a molding compound to flow into the mold chase and/or the individual semiconductor components during the molding process. In such embodiments, the first surface texture prevents mold from flowing out of the mold runner and across the peripheral regions during the molding process. As a result, the first surface texture prevents mold from flowing across the electrical contact portions of the individual semiconductor components. In turn, the second surface texture can reduce (or prevent) ESD events between the semiconductor substrate and the second chase end during an ejection process from the mold chase.

In some embodiments, a process for molding a semiconductor substrate with the mold chase includes placing the semiconductor substrate on a first mold chase. The placement can include aligning a first portion of the first surface with a first region of the semiconductor engaging surface having an unpolished surface texture and/or aligning a second portion of the first surface adjacent the first portion with a second region of the semiconductor engaging surface having a polished surface texture. The process also includes placing a second mold chase on a second surface of the semiconductor substrate opposite the first surface and applying heat and/or pressure to the semiconductor substrate through the first and second mold chases. Once a mold within the mold chase is cured, the process includes releasing (e.g., ejecting) the semiconductor substrate from the first and second mold chases.

In some embodiments, a semiconductor device resulting from the mold chase and/or the method discussed above can have the hybrid surface texture of the mold chase at least partially imprinted on one or more of the components of the resulting semiconductor device. For example, a resulting semiconductor device can include one or more semiconductor dies (e.g. in one or more die stacks of one or more dies), an encapsulant at least partially surrounding the one or more semiconductor dies, and a package support substrate. The package support substrate can include a first surface and a second surface opposite the first surface. The first surface can have a relatively smooth surface texture that at least partially carries the one or more semiconductor dies and the encapsulant. The second surface can have a hybrid surface texture imprint with a first region having a relatively first smooth surface texture (e.g., a cleaned, treated, and/or polished surface texture) and a second region at least partially surrounding the first region having a relatively rough second surface texture (e.g., a matted, uneven, and/or unpolished surface texture).

For ease of reference, the semiconductor device and its components are sometimes described herein with reference to top and bottom, upper and lower, upwards and downwards, and/or horizontal plane, x-y plane, vertical, or z-direction relative to the spatial orientation of the embodiments shown in the figures. It is to be understood, however, that the semiconductor device and its components can be moved to, and used in, different spatial orientations without changing the structure and/or function of the disclosed embodiments of the present technology.

Further, although primarily discussed herein as in the context of a radiation shield for protecting a die stack in a semiconductor device, one of skill in the art will understand that the scope of the technology is not so limited. For example, the radiation shields disclosed herein can also be used to shield various other components of a semiconductor device and/or at alternative levels of a package containing semiconductor devices.

DESCRIPTION OF THE FIGURES

FIG. 1 is a partially schematic diagram of a mold chase 100 releasing a semiconductor substrate 130 in accordance with some embodiments of the present technology. In the illustrated embodiment, the mold chase 100 includes a first clamp 110 and a second clamp 120 opposite the first clamp 110. The first clamp 110 (also referred to herein as an "upper mold chase," a "first mold chase," an "upper clamp," and/or a "first component,") includes a first substrate engaging surface 112 facing the second clamp 120 (e.g., a lower surface). Similarly, the second clamp 120 (also referred to herein as a "lower mold chase," a "second mold chase," a "lower clamp," and/or a "lower component") includes a second substrate engaging surface 122 facing the first clamp 110 (e.g., an upper surface).

A manufacturing process using the mold chase 100 can include placing a semiconductor substrate 130 (e.g., a printed circuit board (PCB), a semiconductor die substrate, a semiconductor die wafer, a silicon substrate, and/or any other suitable semiconductor substrate) on the second substrate engaging surface 122, then clamping the first and second clamps 110, 120 together under pressure. The manufacturing process can then inject a suitable molding compound into the mold chase 100 and cure the mold compound. During the molding process, the first substrate engaging surface 112 contacts a first surface 132 (e.g., an upper surface) of the semiconductor substrate 130 while the second substrate engaging surface 122 contacts a second surface 134 (e.g., a lower surface) of the semiconductor substrate 130. As a result of the contact and pressure, in some embodiments, the first surface 132 receives an imprint from the first substrate engaging surface 112 and/or the second surface 134 receives an imprint from the second substrate engaging surface 122. The manufacturing process then lifts the first clamp 110 upward and ejects the semiconductor substrate 130 away from the second substrate engaging surface 122 of the second clamp 120.

During the molding process, the second surface 134 of the semiconductor substrate 130 can form a slight electrostatic and/or adhesive bond with the second substrate engaging surface 122 of the second clamp 120. Accordingly, as illustrated in FIG. 1, the mold chase 100 can include one or more ejection pins 124 positioned within holes 126 in the second clamp 120 to aid in ejecting the semiconductor substrate 130. During ejection, the ejection pins 124 (sometimes also referred to herein as "release pins") move upward to contact and push the semiconductor substrate 130 away from the second clamp 120. However, the holes 126 (and therefore the ejection pins 124) must be positioned at a peripheral edge of the second clamp 120 to avoid imprinting the holes 126 into important regions of the second surface 134 during the molding process. As a result, one or more regions 140 of the interface between the second surface 134 and the second substrate engaging surface 122 can remain stuck together. As the ejection pins 124 continue to push upward, an electrostatic discharge ("ESD") event can occur in the regions 140, thereby damaging the semiconductor substrate 130.

In various embodiments, the mold chase 100 can include one or more features that help reduce the frequency and/or severity of ESD events, thereby reducing (or avoiding) the damage to the semiconductor substrate 130. For example, the first and second substrate engaging surfaces 112, 122 can include a surface coating (e.g., a coating to reduce adhesion (e.g., a diamond-like carbon (DLC) coating) and/or provide a resistive layer), the first and/or second clamps 110, 120 can be grounded, an anti-ESD material (e.g., a plasma-treated polished metal) can be included into the mold chase 100 during the molding process, the ejection process can be slowed down, and/or the first and/or second substrate engaging surfaces 112, 122 can include a relatively rough surface texture (e.g., a matted, uneven, and/or unpolished surface texture). In some embodiments, the first and/or second substrate engaging surfaces 112, 122 include a hybrid surface texture with one or more regions that have a relatively rough surface texture and one or more regions that have a relatively smooth surface texture.

Figure 2A:
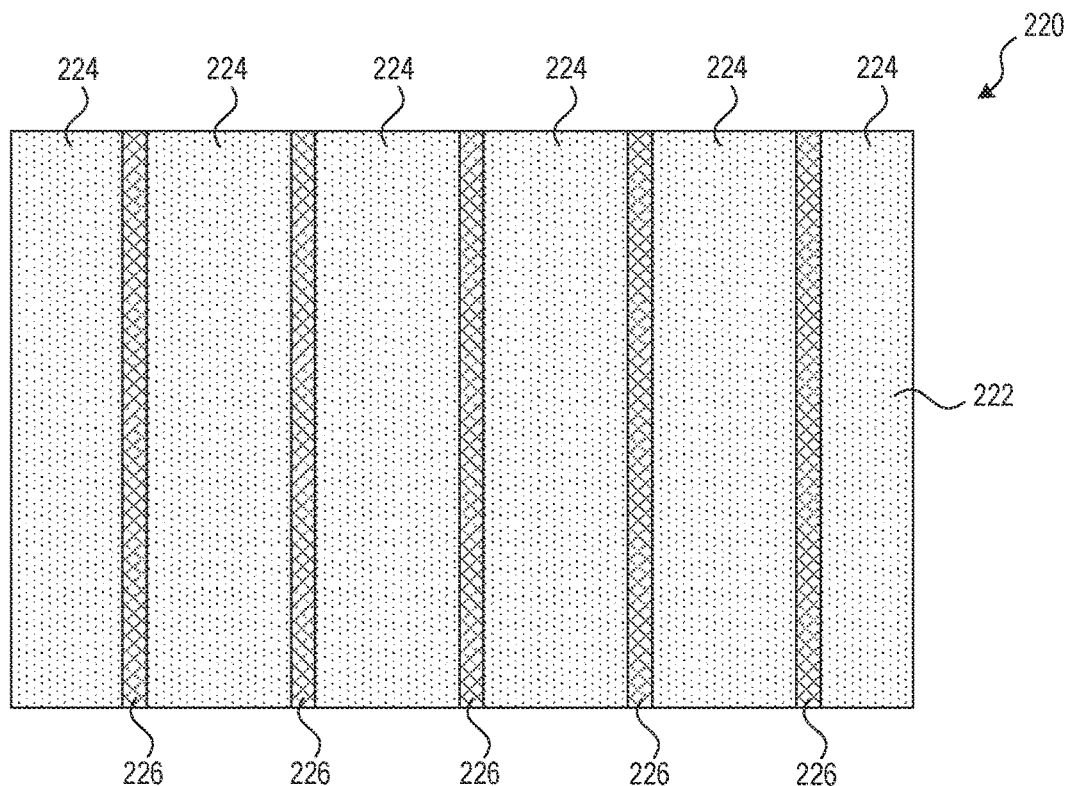
FIG. 2A is a top view of a mold chase with a rough surface texture in accordance with some embodiments of the present technology.

FIG. 2A is a top view of a mold clamp 220 with a relatively rough surface texture for reducing ESD events in accordance with some embodiments of the present technology. In the illustrated embodiment, the mold clamp 220 has a substrate engaging surface 222 that includes first portions 224 and second portions 226. The first portions 224 are configured to engage a semiconductor substrate while the second portions 226 provide channels for a molding compound to flow through the mold chase during the molding process. That is, the first portions 224 are at a first elevation while the second portions are at a second elevation below the first elevation. As a result, the first portions 224 directly engage the semiconductor substrate during the molding process and are at risk of causing ESD events when the semiconductor substrate is ejected. To help reduce the number and/or severity of the ESD events, the first portions 224 can have a relatively rough surface texture (e.g., a matted, uneven, and/or unpolished surface texture).

The relatively rough surface texture reduces the surface area of the first portions 224 that contact the semiconductor substrate (e.g., through the uneven surface texture having peaks and valleys). The reduction in surface area contacting the semiconductor substrate reduces the strength of the electrostatic bond between the substrate engaging surface 222 and the semiconductor substrate, thereby reducing the frequency and/or magnitude of ESD events. However, as discussed below with respect to FIG. 2B, the relatively rough surface texture can allow some of the mold flowing through the second portions 226 during the molding process to flow across the first portions 224 (e.g., allow mold bleed to occur).

Figure 2B:
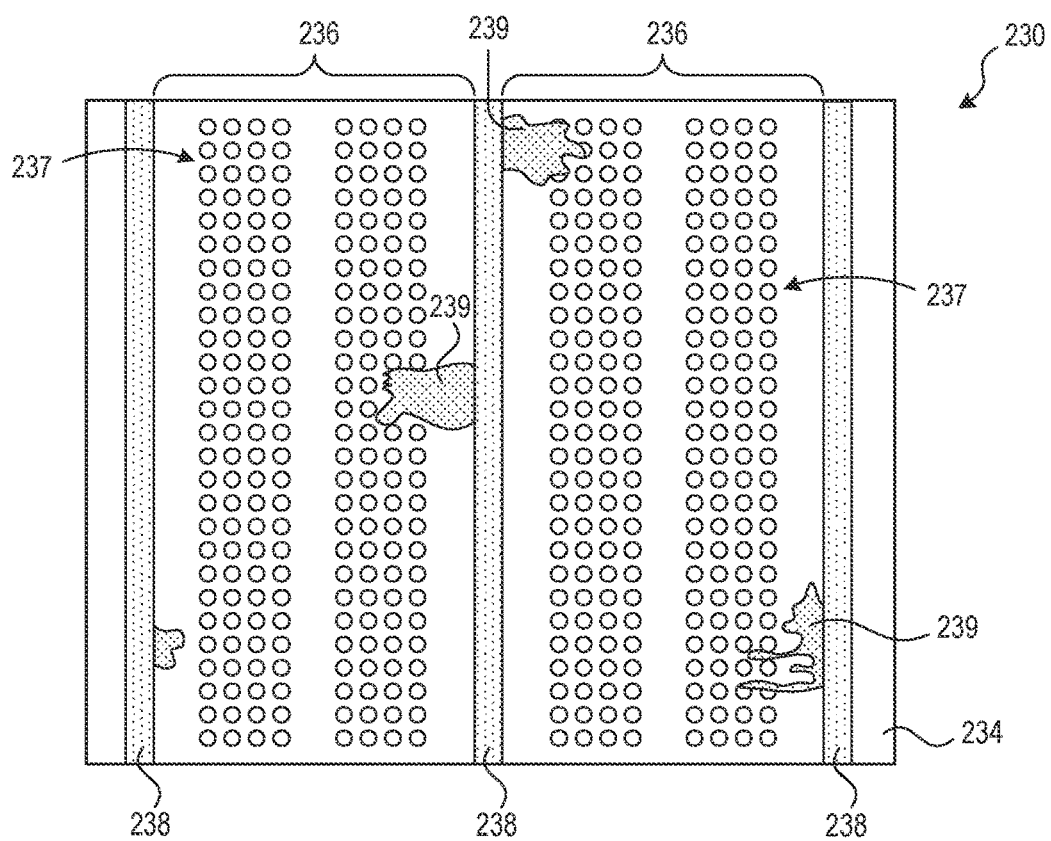
FIG. 2B is a top view of a semiconductor substrate released from the mold chase surface of FIG. 2A in accordance with some embodiments of the present technology.

FIG. 2B is a top view of a semiconductor substrate 230 ejected from the mold clamp 220 of FIG. 2A in accordance with some embodiments of the present technology. In the illustrated embodiment, the semiconductor substrate 230 includes a surface 234 that was released from the substrate engaging surface 222 of the mold clamp 220 (FIG. 2A). The surface 234 includes one or more first regions 236 (two illustrated) corresponding to first portions 224 of the mold clamp 220 and second regions 238 corresponding to second portions 226 of the mold clamp 220. The first regions 236 each include an array of electrical contacts 237 (e.g., bond pads, terminals for inter-package connections, bond sites for solder ball connections, and the like). The second regions 238 include a leftover molding material from the molding process.

The relatively rough surface of the first portions 224 do not bond to the semiconductor substrate 230 as well as a smooth surface would, and therefore reduce the magnitude and/or frequency of ESD events. The reduction helps protect the array of electrical contacts 237 in the first region 236, thereby maintaining the integrity and functionality of the semiconductor substrate 230. However, the relatively rough surface of the first portions 224 can also result in mold bleed regions 239 that are the result of the mold leaking out of the second portion 226 (e.g., through the valleys in the rough surface texture of the first portions 224). As illustrated in FIG. 2B, the mold bleed regions 239 can cover one or more of the contacts in the array of electrical contacts 237. As a result, the mold bleed regions 239 can reduce the electrical functionality of the semiconductor substrate 230 and/or requiring a later cleaning process to be removed.

Figure 3A:
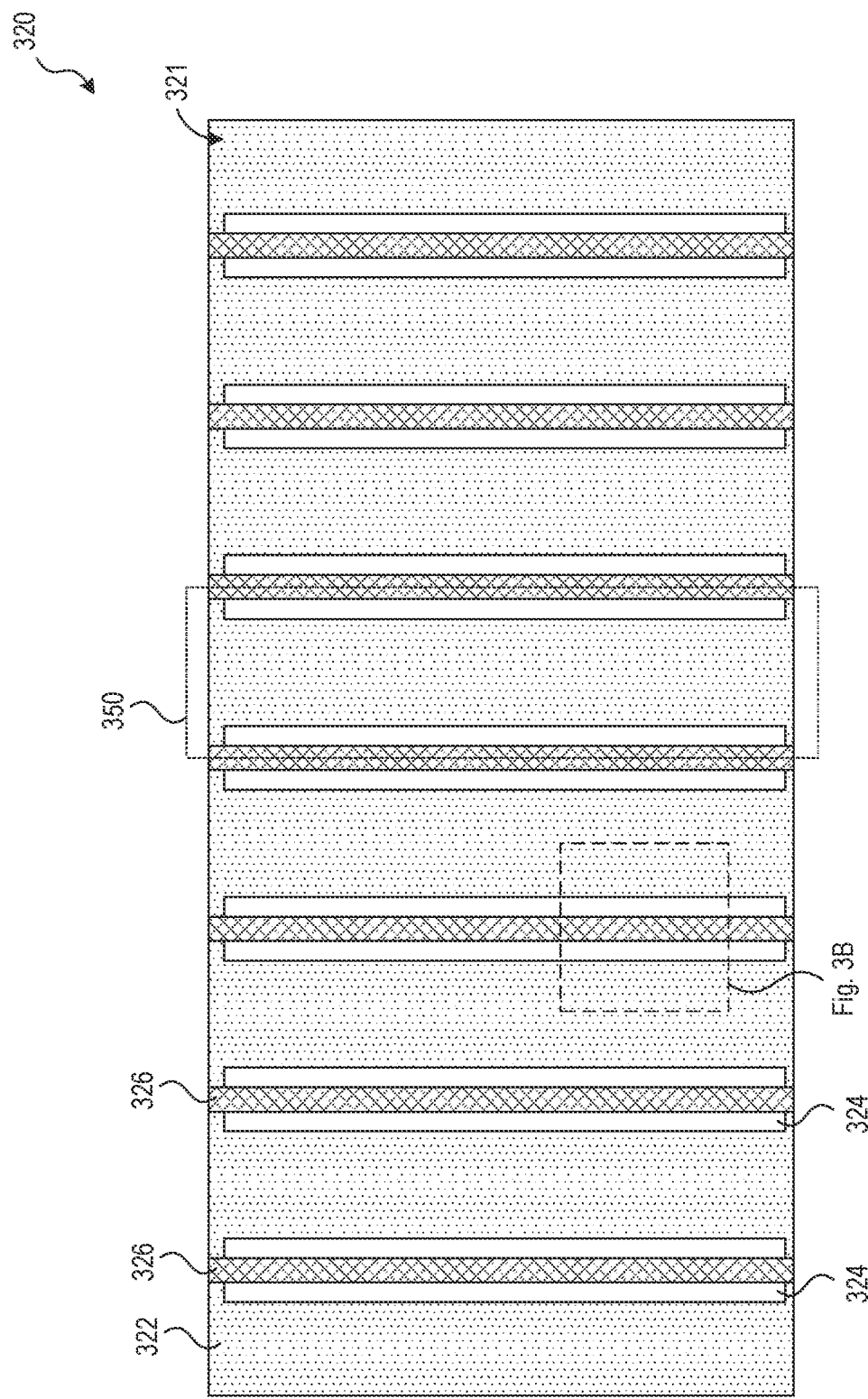
FIGS. 3A and 3B are top views of a mold chase with a hybrid surface texture in accordance with some embodiments of the present technology.
Figure 3B:
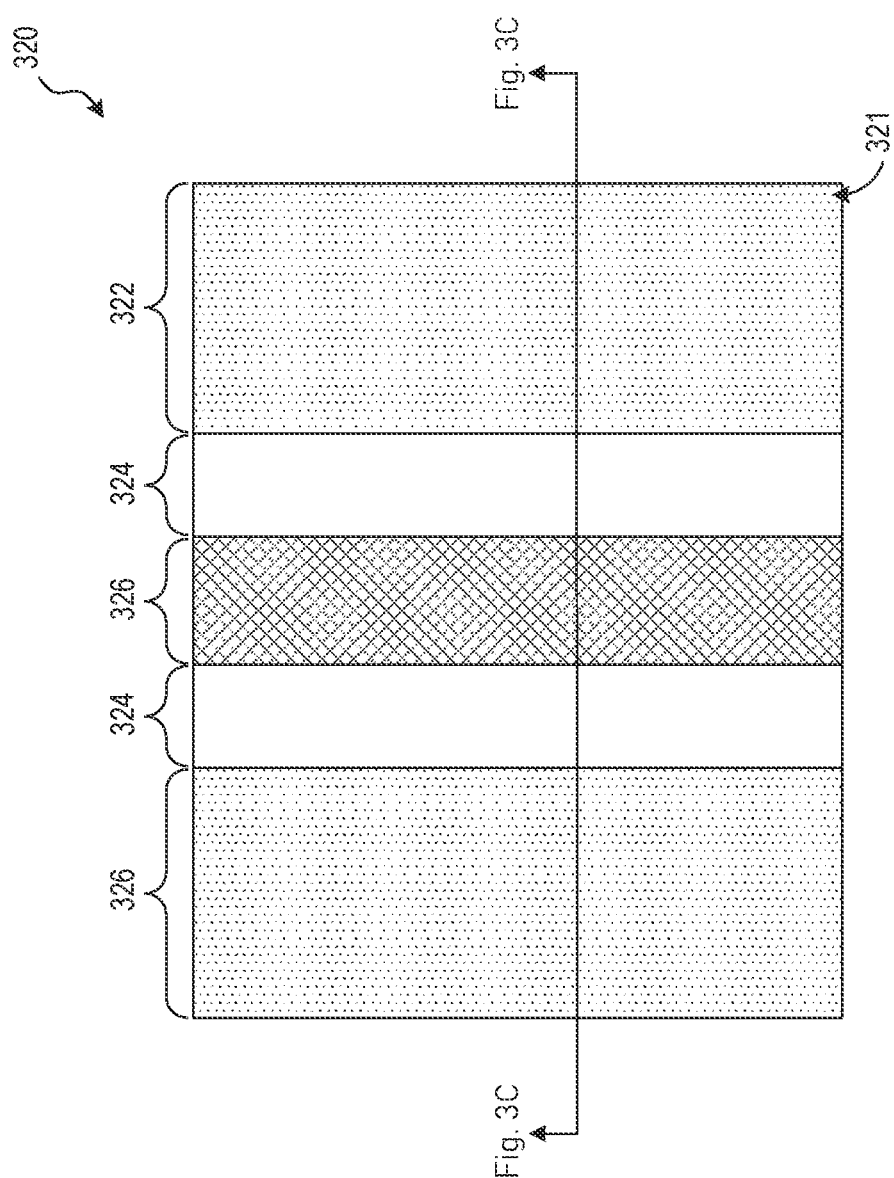

FIGS. 3A and 3B are top views of a mold chase 320 with a hybrid surface texture in accordance with some embodiments of the present technology. As illustrated in FIG. 3A, the mold chase 320 includes a substrate engaging surface 321 that includes a series of columns 350 of features. Each column 350 includes first regions 322, second regions 324 at least partially between the first region 322 (e.g., positioned adjacent and/or laterally next to the first regions 322), and a third region 326 at least partially between the second regions 324 (e.g., positioned adjacent and/or laterally next to the second regions 324). Said another way, each of the second regions 324 is positioned between and at least partially separates corresponding first and third regions 322, 326. As discussed in more detail below, each of the columns 350 can correspond to an individual semiconductor component on a corresponding semiconductor substrate.

The first regions 322 of the substrate engaging surface 321 have a relatively rough, surface texture (e.g., a matted, uneven, and/or unpolished surface texture) while the second regions 324 have a relatively smooth surface texture (e.g., a cleaned, treated, and/or polished surface texture). For example, the first regions 322 can have a single roughness depth ("Rzi," i.e., the distance between the highest peak and the deepest valley within a sampled length of the first and second regions 322, 324) between about 4 micrometers (µm) and about 25 µm, while the second regions 324 can have a Rzi between about 0.01 µm and about 1.0 µm. In another example, the first regions 322 can have a mean roughness depth ("Rz," i.e., the arithmetic mean value of the Rzi of two or more sampled lengths in the first and second regions 322, 324) between about 5 and about 20 µm, while the second regions 324 can have a Rzi between about 0.01 µm and about 0.1 µm. In a specific, non-limiting example, the first regions 322 of the substrate engaging surface can have Rz of about 8±2 µm, while the second regions 324 can have a Rz of about 0.04±2 µm. In yet another example, the first regions 322 can have an Rz that is between about 100 times and about 500 times greater than the Rz than the second regions 324.

The third regions 326 correspond to mold runners in the mold chase 320 (e.g., grooves or tracks where mold flows through the mold chase 320 during a molding process). As discussed above, the relatively rough surface texture of the first regions 322 reduces the surface area of the substrate engaging surface 321 that contacts a semiconductor substrate during a molding process. As a result, the magnitude and/or frequency of ESD events during an ejection stage of the molding process is reduced (or eliminated). In contrast, the smooth surface texture of the second regions 324 makes results in relatively high contact between the substrate engaging surface 321 and the semiconductor substrate during the molding process. While the increased contact can increase the adhesion between the substrate engaging surface 321 and the semiconductor substrate, the increased contact can also prevent the mold bleed issues discussed above with reference to FIG. 2B.

As best illustrated with respect to FIG. 3A, the first regions 322 can occupy a larger surface area than the second regions 324. The relatively larger surface area occupied by the first regions 322 can increase the reduction in magnitude and/or frequency of ESD events during the ejection stage. In contrast, as best illustrated with respect to FIG. 3B, the second regions 324 can physically separate the first regions 322 from the third regions 326. As a result, the second regions 324 act as a physical barrier to the mold flowing through the third regions 326 during the molding process to reduce (or prevent) mold bleed issues. Said another way, the substrate engaging surface 321 has a hybrid surface texture that simultaneously reduces the magnitude and/or frequency of ESD events and reduces (or avoids) mold bleed concerns.

Figure 3C:
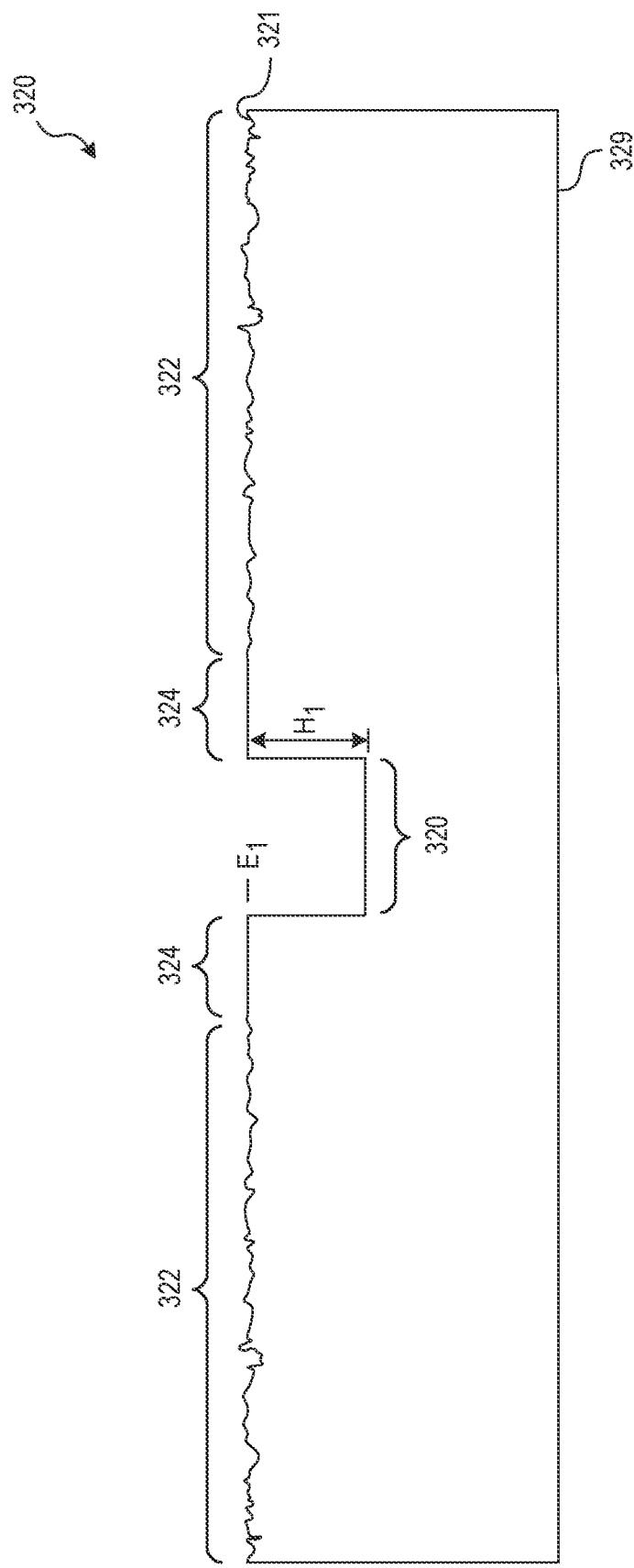
FIG. 3C is a cross-sectional view of the mold chase of FIGS. 3A and 3B in accordance with some embodiments of the present technology.

FIG. 3C is a cross-sectional view of the mold chase 320 of FIG. 3B that provides an additional view of the hybrid surface texture in accordance with some embodiments of the present technology. For example, the cross-sectional view illustrates the relatively rough surface texture of the first regions 322, along with the relatively smooth surface texture of the second regions 324. The cross-sectional view also illustrates the mold runner track that is created by a vertical offset between the second regions 324 and the third regions 326. In the illustrated embodiment, the third regions 326 are offset from the second regions 324 by a distance $H_1$ (e.g., a depth of the mold runner). As a result, when the substrate engaging surface 321 engages the semiconductor material during the molding process, a molding compound can flow through the mold chase 320 via the troughs in the third regions 326.

As further illustrated in FIG. 3C, the second regions 324 of the substrate engaging surface 321 are at a first elevation $E_1$, while the first regions 322 include peaks at about the first elevation $E_1$ and valleys below the first elevation. As a result, the second regions 324 engage the semiconductor material during the molding process to form a fluid tight seal between the third regions 326 and the first regions 322. Further, the contact between the semiconductor material and the first regions 322 can be limited to the peaks, thereby reducing the overall surface area of the substrate engaging surface 321 that engages the semiconductor material during the molding process. As a result of the reduction in surface area, the magnitude and/or frequency of ESD events during the ejection process can be reduced (or eliminated).

It will be understood that, in addition to the hybrid surface texture discussed above, the mold chase 320 can also include any of the features discussed above with reference to FIG. 1. For example, the substrate engaging surface 321 can be coated periodically with a chemical material to reduce adhesion between the substrate engaging surface 321 and a semiconductor substrate thereon, thereby further reducing (or preventing) ESD events. In another example, the mold chase 320 can be electrically biased and/or grounded, thereby further reducing (or preventing) ESD events. In yet another example, the mold chase 320 can include an anti-ESD surface material, thereby further reducing (or preventing) ESD events. Further, it will also be understood that the mold chase 320 can also include the holes and ejection pins discussed above with reference to FIG. 1 and that a discussion of these features is omitted to avoid repetition.

Figure 4A:
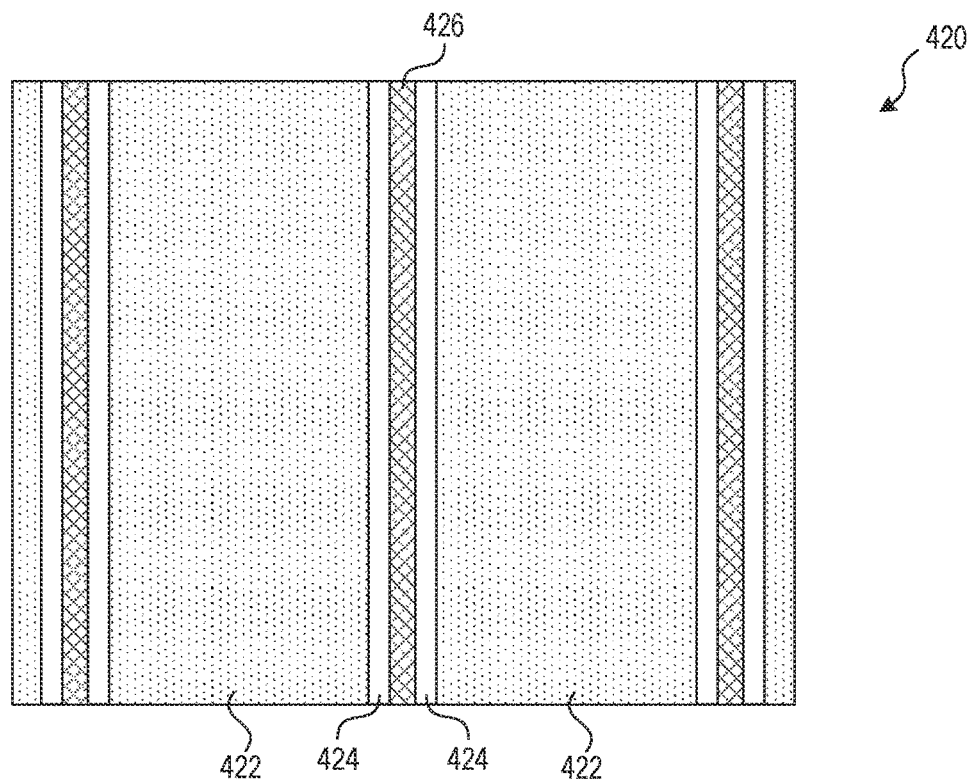
FIG. 4A is a top view of a mold chase with a hybrid surface texture in accordance with further embodiments of the present technology.

FIG. 4A is a top view of a mold chase 420 with a hybrid surface in accordance with further embodiments of the present technology. As illustrated, the mold chase 420 is generally similar to the mold chase 320 discussed above with reference to FIG. 3A. For example, the mold chase 420 has a substrate engaging surface 421 that includes first regions 422, second regions 424 adjacent the first regions 422, and third regions 426 adjacent the second regions 424. Further, the first regions 422 include a relatively rough surface texture; the second regions 424 include a relatively smooth surface texture; and the third regions 426 are recessed from the second regions 424 to provide a flow channel (e.g., for a molding material) through the mold chase 420. In the illustrated embodiment, the second regions 424 fully separate the first and third regions 422, 426 from each other. As a result, the relatively smooth surface texture of the second regions 424 can provide a full barrier against mold flow across the substrate engaging surface 421 during the molding process.

Figure 4B:
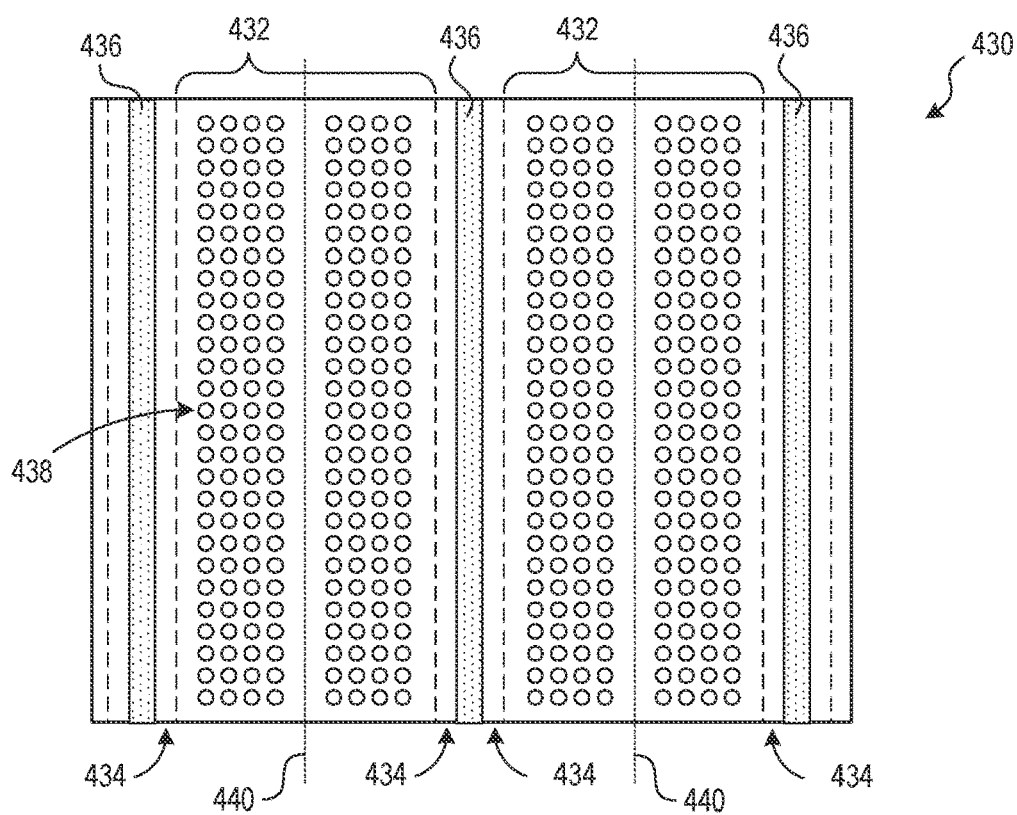
FIG. 4B is a top view of a semiconductor substrate released from the mold chase of FIG. 4A in accordance with some embodiments of the present technology.

FIG. 4B is a top view of a semiconductor substrate 430 released from the mold chase 420 of FIG. 4A in accordance with some embodiments of the present technology. In the illustrated embodiment, the semiconductor substrate 430 includes a surface 431 that engaged the substrate engaging surface 421 of the mold chase 420 (FIG. 4A) with corresponding regions. For example, the surface 431 includes first regions 432, second regions 434 adjacent the first regions 432 (e.g., positioned on lateral sides of the first regions 432), and third regions 436 adjacent the second regions 434 (e.g., positioned on lateral sides of the second regions 434). That is, the first, second, and third regions 432, 434, 436 are positioned such that the first regions 432 engaged the first regions 422 (FIG. 4A), the second regions 434 engaged the second regions 424, and the third regions 436 engaged the third regions 426. As a result, and as discussed in more detail below, the surface 431 can include an imprint of the substrate engaging surface 421 and/or various features leftover from the molding process. Purely by way of example, the third regions 426 can include a protrusion (see FIG. 5B) of the molding compound leftover from the flow paths of the third regions 426 (FIG. 4A).

As further illustrated in FIG. 4B, the surface 431 of the semiconductor substrate 430 can include one or more bond sites 438 positioned within each of the first regions 422. As discussed above, the smooth surface texture of the second regions 424 on the substrate engaging surface 421 (FIG. 4A) at least partially block the mold material from flowing across the second regions 434 and into the first regions 432 during a molding process. As a result, the smooth surface texture of the second regions 424 helps maintain and/or protect the bond sites 438 in the first region 432 from the mold bleed issues discussed above with reference to FIG. 2B.

In various embodiments, the bond sites 438 can include bond pads, exposed terminals of through substrate vias, solder structures, pre-solder layers, seed layers, and/or various other suitable conductive structures. In the illustrated embodiment, the bond sites 438 are disposed in an array in each of the first regions 432. In other embodiments, the semiconductor substrate 430 includes only a single bond site 438 in each of the first regions 432.

In some embodiments, the semiconductor substrate 430 can include multiple (e.g., two, three, four, five, ten, twenty, one hundred, or any other suitable number) of individual semiconductor components. Said another way, the semiconductor substrate 430 can be a sheet, wafer, and/or any other bulk structure of semiconductor components that are molded together at one time to increase the efficiency of a manufacturing process. The mold chase 420 can also include any number of columns (e.g., two, three, four, five, ten, twenty, one hundred, or any other suitable number) correlated to the number of individual semiconductor components on a single semiconductor substrate 430 (or a maximum number of individual semiconductor components the mold chase 420 can handle). After the molding process, as well as any other suitable processing stages, the semiconductor substrate 430 can be singulated to separate the individual semiconductor components. For example, in the illustrated embodiment, the semiconductor substrate 430 can be cut along singulation lines 440 to separate the semiconductor substrate 430 into individual semiconductor components. As illustrated, the singulation lines 440 run through the center of the first regions 432. As a result, and as discussed in more detail below, the first regions 432 can occupy a periphery of the singulated semiconductor components while the second and third regions 434, 436 can be positioned in the center of the singulated semiconductor components.

Figure 5A:
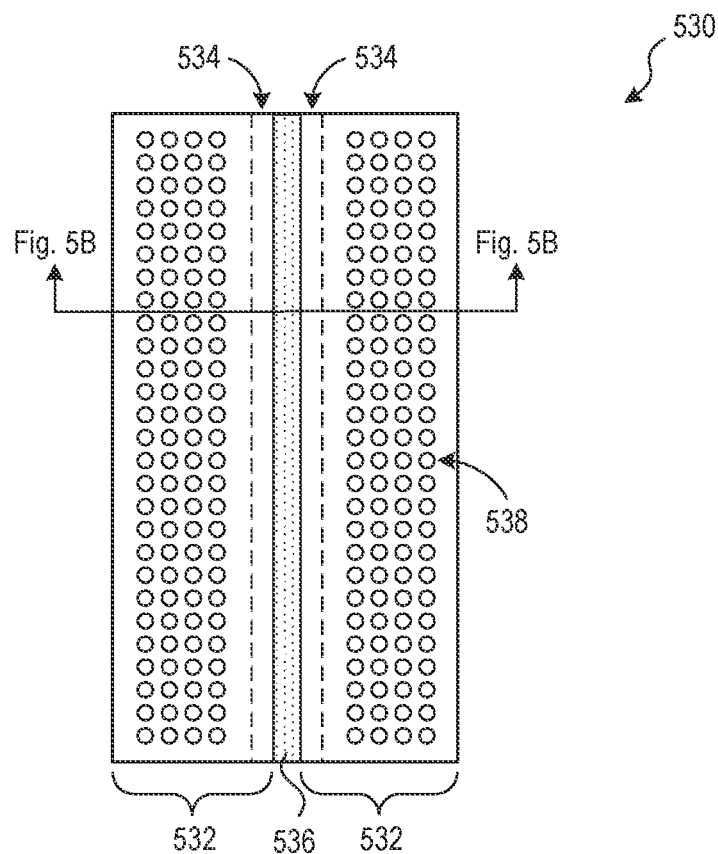
FIG. 5A is a top view of a semiconductor substrate after singulation in accordance with some embodiments of the present technology.

FIG. 5A is a top view of a singulated semiconductor substrate 530 resulting from cuts along the singulation lines 440 of FIG. 4B in accordance with some embodiments of the present technology. In the illustrated embodiment, accordingly, the singulated semiconductor substrate 530 has a first surface 531 that includes first regions 532 in peripheral portions of the first surface 531, second regions 534 positioned in a central portion of the first surface 531, and a third region 536 along a centerline of the first surface 531. Said another way, the third region 536 is positioned in a centermost portion of the first surface 531 of the singulated semiconductor substrate 530, the second regions 534 are positioned on lateral, peripheral sides of the third region 536 (e.g., at least partially surrounding the third region 536), and the first regions 532 are positioned on lateral, peripheral sides of the second regions 534 (e.g., at least partially surrounding the second regions 534).

As further illustrated in FIG. 5A, each of the first regions 532 includes an array of bond sites 538 at the first surface 531 of the singulated semiconductor substrate 530. As discussed above, the bond sites 538 can include bond pads, exposed terminals of through substrate vias, solder structures, pre-solder layers, seed layers, and/or various other suitable conductive structures. Further, it will be understood that although depicted as including a four by twenty-seven array of bond sites 538, the first regions 532 can include any other suitable number of bond sites arranged in any other suitable array.

Figure 5B:
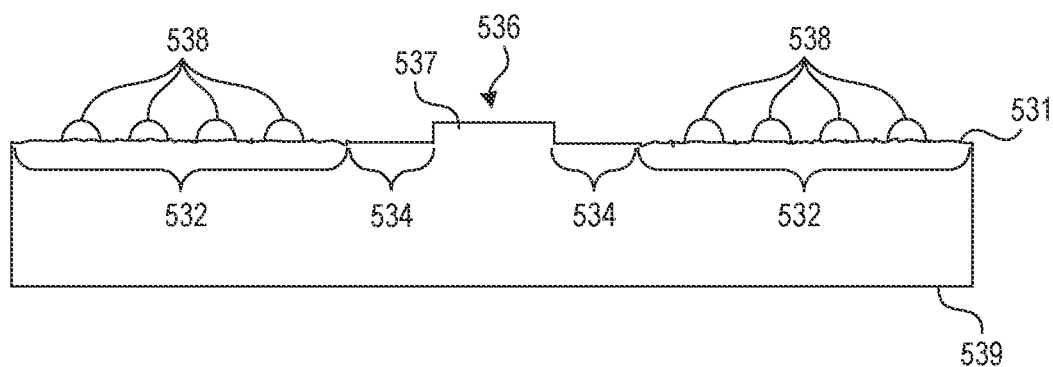
FIG. 5B is a cross-sectional view of the semiconductor substrate of FIG. 5A in accordance with some embodiments of the present technology.

FIG. 5B is a cross-sectional view of the singulated semiconductor substrate 530 of FIG. 5A illustrating an imprint from the mold chase 420 of FIG. 4A in accordance with some embodiments of the present technology. In the illustrated embodiment, the first regions 532 contain an imprint of the relatively rough surface texture of the first regions 422 of the mold chase 420. Similarly, the second regions 534 contain an imprint of the relatively smooth surface texture of the second regions 424 of the mold chase 420. As a result, the first regions 532 have a relatively rough surface texture (e.g., a matted, uneven, and/or unpolished surface texture) while the second regions 534 have a relatively smooth surface texture (e.g., a cleaned, treated, and/or polished surface texture).

In the illustrated embodiment, the third region 536 includes a protrusion 537 of leftover mold material from the flow channel of the third regions 426 of the mold chase 420 (FIG. 4A). However, because the relatively smooth surface texture of the second regions 424 physically blocked the mold material, the first regions 532 are relatively (or completely) free from any leftover mold material and/or mold bleed regions. As a result, each of the bond sites 538 in the first regions 532 are exposed for electrical, thermal, and/or mechanical coupling.

As discussed above, in some embodiments, the overall mold clamp can include one mold chase with a hybrid surface texture and a second mold chase with a relatively smooth surface texture across the entire surface. For example, in some embodiments, the upper mold chase of a mold clamp has the relatively smooth surface texture across the entire surface because ESD events are less common at the second surface 539 during the ejection process (e.g., gravitational forces allow for a clean release). Accordingly, the upper mold chase does not face the same concerns with ESD events, and therefore can have the relatively smooth surface texture across the entire surface. As a result, as further illustrated in FIG. 5B, the singulated semiconductor substrate 530 can have a second surface 539 opposite the first surface 531 that is imprinted with the relatively smooth surface texture (e.g., is relatively smooth, even, and/or polished). In some embodiments, however, both the second surface 539 and the first surface 531 are imprinted with a hybrid surface texture, for example when both ends of a mold chase include the hybrid surface texture.

It will be understood that, in addition to the hybrid surface texture discussed above, the mold chases 420, 520 can also include any of the features discussed above with reference to FIG. 1. For example, the substrate engaging surfaces 421, 521 can be coated periodically with a chemical material to reduce adhesion between the substrate engaging surfaces 421, 521 and a semiconductor substrate thereon, thereby further reducing (or preventing) ESD events. In another example, the mold chases 420, 520 can be electrically biased and/or grounded, thereby further reducing (or preventing) ESD events. In yet another example, the mold chases 420, 520 can include an anti-ESD surface material, thereby further reducing (or preventing) ESD events. Further, it will also be understood that the mold chases 420, 520 can also include the holes and ejection pins discussed above with reference to FIG. 1 and that a discussion of these features is omitted to avoid repetition.

Figure 6:
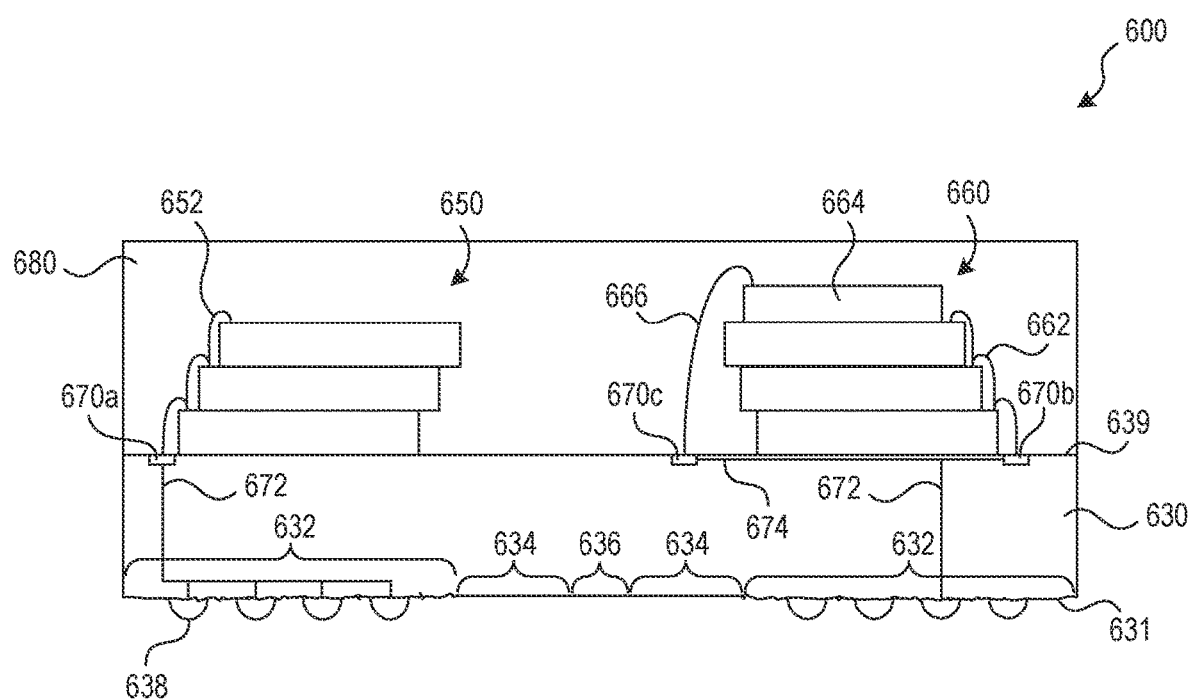
FIG. 6 is a cross-sectional view of a semiconductor device with a package support substrate manufactured in accordance with some embodiments of the present technology.

FIG. 6 is a cross-sectional view of a semiconductor device 600 with a package support substrate 630 manufactured in accordance with some embodiments of the present technology. In the illustrated embodiment, the package support substrate 630 is generally similar to the singulated semiconductor substrate 530 discussed above with respect to FIGS. 5A and 5B. For example, the package support substrate 630 has a first surface 631 (e.g., a lower surface) and a second surface 639 (e.g., an upper surface) opposite the first surface 631. The first surface 631 includes first regions 632 positioned in peripheral portions of the package support substrate 630, second regions 634 positioned central to and/or between the first regions 632, and a third region 636 central to and/or between the second regions 634. Further, the first regions 632 include a relatively rough surface texture imprint while the second regions 634 include a relatively smooth surface texture imprint. In the illustrated embodiment, however, the first surface 631 of the package support substrate 630 has been further processed (e.g., chemically and/or mechanically planarized) to remove any protrusion of leftover mold from the third region 636. As a result, an array of bond sites 638 in the first regions 632 protrudes furthest from the first surface 631 to aid in electrically, thermally, and/or mechanically coupling the semiconductor device 600 to any other component (e.g., a circuit board in a dynamic random-access memory).

As further illustrated in FIG. 6, the semiconductor device 600 can also include a first stack of semiconductor dies 650 ("first die stack 650") and a second stack of semiconductor dies 660 ("second die stack 660"). The first and second die stacks 650, 660 are each carried by the second surface 639 of the package support substrate 630. In the illustrated embodiment, the first die stack 650 includes three semiconductor dies, each of which is coupled to a first bond site 670a on the second surface 639 of the package support substrate 630 by a series of wire bonds 652. Similarly, the second die stack 660 includes three semiconductor dies coupled to a second bond site 670b by a series of wire bonds 662; and an uppermost die 664 coupled to a third bond site 670c by a long wire bond 666. As illustrated in FIG. 6, each of the bond sites 670 on the second surface 639 of the package support substrate 630 is electrically coupled to one or more of the bond sites 638 on the first surface 631 of the package support substrate by internal electronics 672 (e.g., one or more redistribution layers at the first and/or second surfaces 631, 639, one or more through substrate vias, and/or any other suitable connections). As a result, each of the dies in the first and second die stacks 650, 660 can be electrically coupled to the other dies in the first and second die stacks 650, 660 and/or can be electrically coupled to semiconductor components outside of the semiconductor device 600.

In various embodiments, each of the dies in the first and second die stacks 650, 660 can be a memory die, a logic die, a controller die, or any other suitable kind of die. In a specific, non-limiting example, each of the dies in the first die stack 650 can be a memory die, the lower three dies in the second die stack 660 can each be a logic die, and the uppermost die 664 can be a controller die. In the specific example, the uppermost die 664 can be electrically coupled to one or more components outside of the semiconductor device 600 to receive signals and/or instructions, and electrically coupled to the memory and logic dies to instruct the memory and logic dies based on the received signals and/or instructions. In various other examples, any of the dies in the first and second die stacks 650, 660 can be any other suitable die. Further, it will be understood that although illustrated as stacks of three and four dies, respectively, the first and second die stacks 650, 660 can each include any other suitable number of dies in their stacks (e.g., one, two, five, ten, sixteen, thirty-two, fifty, sixty-four, and/or any other suitable number). Still further, although illustrated with two die stacks, it will also be understood that the semiconductor device 600 can include any suitable number of die stacks. In a specific, non-limiting example, the semiconductor device 600 can include a single die stack carried by a central portion of the second surface 639 of the package support substrate 630.

Returning to FIG. 6, in the illustrated embodiment, the semiconductor device 600 includes an encapsulant 680 that at least partially covers the components of the semiconductor device 600. In the illustrated embodiment, the encapsulant 680 completely covers each of the first and second die stacks 650, 660 as well as their respective wire bonds. In some embodiments, one or more components (e.g., one or more dies, one or more bond sites on the package support substrate 630, and/or one or more of the wire bonds are at least partially exposed after the encapsulant 680 is formed on the semiconductor device 600. In some embodiments, the encapsulant includes an epoxy resin that is fully cured on the semiconductor device 600.

Figure 7:
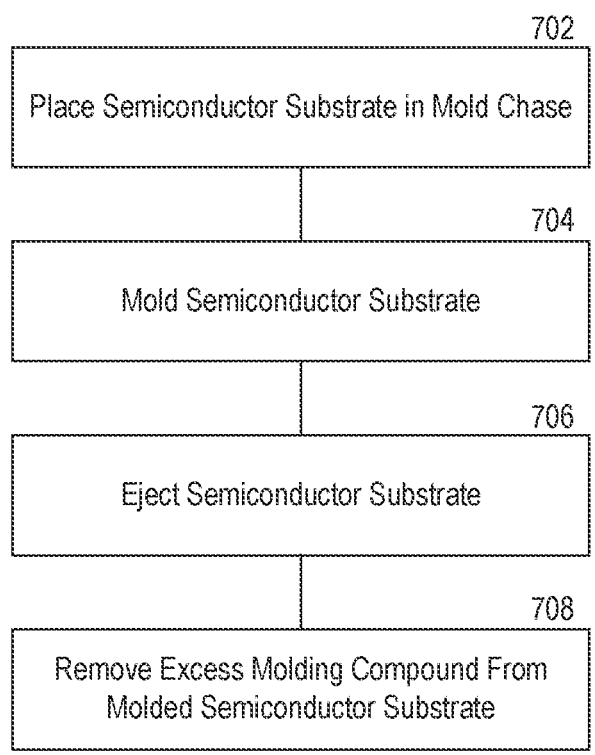
FIG. 7 is a flow diagram of a process for manufacturing a semiconductor substrate with mold chase that includes hybrid surface texture in accordance with some embodiments of the present technology.

FIG. 7 is a flow diagram of a process 700 for manufacturing a semiconductor substrate with a mold chase that includes a hybrid surface texture in accordance with some embodiments of the present technology. In the illustrated embodiment, the process 700 begins at block 702 with placing a semiconductor substrate in a mold clamp. Placing the semiconductor substrate in the mold clamp can include aligning one or more regions (or features) of the semiconductor substrate with one or more regions (or features) of the lower and/or upper mold chases in the mold clamp. In some embodiments, for example, placing the semiconductor substrate in the mold clamp includes aligning predetermined regions of the semiconductor substrate with regions of the lower mold chase having a relatively rough surface texture.

At block 704, the process 700 includes molding the semiconductor substrate within the mold clamp. In various embodiments, molding the semiconductor substrate can include injecting a mold material into the mold clamp and/or the semiconductor substrate through one or more mold runners in the mold chase, pressurizing the mold chase, heating the mold chase, and/or otherwise curing any injected mold compound.

At block 706, the process 700 includes ejecting the semiconductor substrate from the mold clamp. The ejection process includes lifting off or otherwise removing a first mold chase (e.g., an upper mold chase), then pressing the semiconductor substrate away from a second mold chase (e.g., a lower mold chase). In some embodiments, as discussed above with respect to FIG. 1, the second mold chase can include one or more ejection pins positioned along a substrate engaging surface. The ejection pins can press the semiconductor substrate upward from the substrate engaging surface, thereby disengaging the semiconductor substrate from the second mold chase. Once disengaged, the ejection process can include lifting off or otherwise removing the semiconductor substrate from the second mold chase.

At block 708, the process 700 includes further processing the molded semiconductor substrate. In some embodiments, the further processing includes removing excess mold material from the semiconductor substrate (e.g., removing protrusions left over from the mold runners in the second mold chase via a planarization process). In some embodiments, the further processing includes singulating semiconductor components from the semiconductor substrate via one or more cutting processes. In some embodiments, the further processing includes forming one or more insulation and/or metallization layers on various surfaces of semiconductor substrate, one or more bonding features (e.g., solder balls or other conductive interconnects) on bond sites on the semiconductor substrate, and/or forming any other suitable features on the semiconductor substrate.

In some embodiments, the process 700 can omit some of the blocks discussed above. For example, in some embodiments, the process 700 omits block 708 altogether to complete the manufacturing process after the semiconductor substrate is ejected from the mold clamp. In a specific, non-limiting example, the process 700 can be executed to complete molding on an already singulated package support substrate (e.g., a printed circuit board) that has tolerance for excess mold materials. In this example, the package support substrate can be complete once ejected from the mold clamp, thereby not requiring any further processing.

Figure 8:
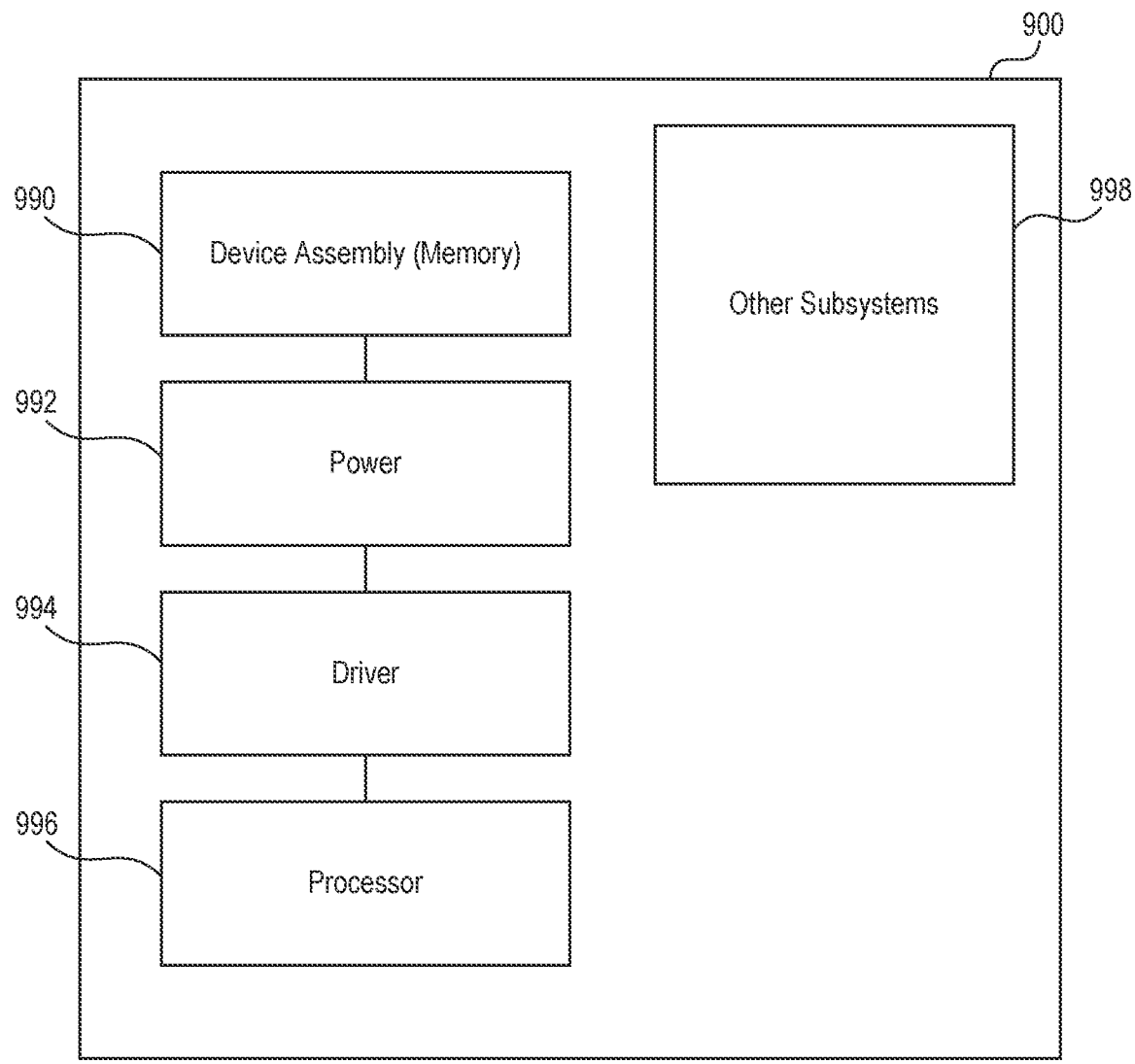
FIG. 8 is a schematic view of a system that includes a semiconductor die assembly configured in accordance with embodiments of the present technology.

FIG. 8 is a schematic view of a system 800 that includes a semiconductor die assembly configured in accordance with embodiments of the present technology. Any one of the semiconductor devices having the features and/or resulting from the molding processes described above with reference to FIGS. 1A-7 can be incorporated into any of a myriad of larger and/or more complex systems, a representative example of which is system 800 shown schematically in FIG. 8. The system 800 can include a memory 890 (e.g., SRAM, DRAM, flash, and/or other memory devices), a power supply 892, a drive 894, a processor 896, and/or other subsystems or components 898. Semiconductor devices like those described above with reference to FIGS. 4B, 5B, and 6 (or resulting from the processes described above with respect to 1A-4A, 5A, and 7), can be included in any of the elements shown in FIG. 8. For example, the memory 890 can include a stacked semiconductor device with a package support substrate produced with the molding chase discussed above with respect to FIGS. 3A-3C. The resulting system 800 can be configured to perform any of a wide variety of suitable computing, processing, storage, sensing, imaging, and/or other functions. Accordingly, representative examples of the system 800 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 800 include lights, cameras, vehicles, etc. With regard to these and other example, the system 800 can be housed in a single unit or distributed over multiple interconnected units, e.g., through a communication network. The components of the system 800 can accordingly include local and/or remote memory storage devices and any of a wide variety of suitable computer-readable media.

CONCLUSION

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded. Further, the terms "approximately" and "about" are used herein to mean within at least within 10 percent of a given value or limit. Purely by way of example, an approximate ratio means within a ten percent of the given ratio.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

I claim:

1. A mold chase for molding semiconductor devices, comprising:
   a first clamp; and
   a second clamp having an engaging surface facing the first clamp, wherein the engaging surface includes:
      a first region having a first surface texture, the first region positioned to engage a first portion of a semiconductor substrate having electrical contacts; and
      a second region adjacent the first region and having a second surface texture smoother than the first surface texture, the second region positioned to engage a second portion of the semiconductor substrate adjacent the first portion during a molding process.

2. The mold chase of claim 1 wherein the second region of the engaging surface is at a first elevation, and wherein the second clamp further comprises a third region adjacent the second region and at a second elevation different than the first elevation to provide a flow channel for a molding compound through the mold chase when the semiconductor substrate is engaged by the engaging surface.

3. The mold chase of claim 1 wherein the first surface texture in the first region includes peaks and valleys configured to reduce a contact area between the engaging surface and the semiconductor substrate during the molding process.

4. The mold chase of claim 1 wherein the second surface texture in the second region is configured to prevent a mold compound from flowing across the second portion of the semiconductor substrate during the molding process.

5. The mold chase of claim 1 wherein the first region is adjacent a first longitudinal side of the second region, wherein the engaging surface further comprises a third region adjacent a second longitudinal side of the second region, wherein the third region includes the first surface texture positioned to engage a third portion of the semiconductor substrate having electrical contacts.

6. The mold chase of claim 5 wherein the second region is adjacent a first peripheral edge of the first region, wherein the engaging surface further comprises a fourth region adjacent a second peripheral edge of the first region opposite the first peripheral edge, and wherein the fourth region includes the second surface texture positioned to engage a fourth portion of the semiconductor substrate.

7. The mold chase of claim 1 wherein:
   the engaging surface includes an array of holes; and
   the mold chase further comprises an ejection pin in each hole in the array of holes, each ejection pin configured to engage the semiconductor substrate to push the semiconductor substrate away from the engaging surface.

8. The mold chase of claim 1 wherein the second region of the engaging surface includes at least one of a plasma-treated polished metal or a diamond-like carbon (DLC) coating.

9. The mold chase of claim 1 wherein the engaging surface on the second clamp is electrically grounded.

10. A mold chase for molding semiconductor devices, comprising:
    a first clamp; and
    a second clamp having an engaging surface facing the first clamp, wherein the engaging surface includes:

a first region having a first surface texture, wherein the first region is positioned to engage a portion of a semiconductor substrate having electrical contacts; and a second region adjacent to the first region and having a second surface texture smoother than the first surface texture, wherein the second region is positioned to prevent a molding compound from flowing into the first region during a molding process.

11. The mold chase of claim 10 wherein the engaging surface further includes a third region adjacent to the second region, wherein the third region is configured to deliver the molding compound to the semiconductor substrate during the molding process, wherein the second region is positioned between the third region and the first region.

12. The mold chase of claim 11 wherein the portion of the semiconductor substrate is a first portion, wherein the second region is positioned between a first edge of the third region and the first region, and wherein the engaging surface further includes:

a fourth region adjacent to a second edge of the third region and having the second surface texture; and a fifth region adjacent to the fourth region and having the first surface texture, the fifth region configured to engage a second portion of a semiconductor substrate having electrical contacts, wherein the fourth region is positioned between the third region and the fifth region to prevent the molding compound from flowing into the fifth region.

13. The mold chase of claim 10 wherein the second surface texture includes a planar surface, wherein the first surface texture includes peaks and valleys configured to reduce a contact area between the engaging surface and the semiconductor substrate during the molding process, and wherein the peaks are coplanar with the planar surface of the second surface texture.

14. The mold chase of claim 10 wherein:

the engaging surface includes an array of holes; and the mold chase further comprises an ejection pin in each hole in the array of holes, each ejection pin configured to engage the semiconductor substrate to push the semiconductor substrate away from the engaging surface.

* * * * *